United States Patent
Sawada et al.

(10) Patent No.: US 9,208,812 B2
(45) Date of Patent: Dec. 8, 2015

(54) SOFT MAGNETIC ALLOY FOR MAGNETIC RECORDING MEDIUM, SPUTTERING TARGET MATERIAL, AND MAGNETIC RECORDING MEDIUM

(75) Inventors: Toshiyuki Sawada, Himeji (JP); Hiroyuki Hasegawa, Himeji (JP); Atsushi Kishida, Himeji (JP)

(73) Assignee: Sanyo Special Steel Co., Ltd., Himeji-shi (JP)

( * ) Notice: Subject to any disclaimer, the term of this patent is extended or adjusted under 35 U.S.C. 154(b) by 482 days.

(21) Appl. No.: 13/817,645

(22) PCT Filed: Aug. 19, 2011

(86) PCT No.: PCT/JP2011/068790
§ 371 (c)(1),
(2), (4) Date: Apr. 24, 2013

(87) PCT Pub. No.: WO2012/026405
PCT Pub. Date: Mar. 1, 2012

(65) Prior Publication Data
US 2013/0224067 A1    Aug. 29, 2013

(30) Foreign Application Priority Data
Aug. 24, 2010 (JP) ................. 2010-186876

(51) Int. Cl.
- *C22C 19/07* (2006.01)
- *C23C 14/34* (2006.01)
- *G11B 5/65* (2006.01)
- *G11B 5/667* (2006.01)
- *G11B 5/851* (2006.01)

(52) U.S. Cl.
CPC ............. *G11B 5/656* (2013.01); *C22C 19/07* (2013.01); *C23C 14/3407* (2013.01); *C23C 14/3414* (2013.01); *G11B 5/667* (2013.01); *G11B 5/851* (2013.01)

(58) Field of Classification Search
CPC ..... C22C 19/07; C23C 14/3407; G11B 5/656
See application file for complete search history.

(56) References Cited

U.S. PATENT DOCUMENTS

| | | |
|---|---|---|
| 2005/0223848 A1 | 10/2005 | Ueno et al. |
| 2007/0030724 A1 | 2/2007 | Hosomi et al. |
| 2008/0090106 A1 | 4/2008 | Braunstein et al. |
| 2010/0209284 A1 | 8/2010 | Sawada et al. |

FOREIGN PATENT DOCUMENTS

| | | |
|---|---|---|
| CN | 1967892 A | 5/2007 |
| CN | 101174426 A | 5/2008 |
| JP | 9293611 A | 11/1997 |
| JP | 2001283427 A | 10/2001 |
| JP | 2001344726 A | 12/2001 |
| JP | 2003123239 A | 4/2003 |
| JP | 2003346333 A | 12/2003 |
| JP | 200430740 A | 1/2004 |
| JP | 2005320627 A | 11/2005 |
| JP | 2008097812 A | 4/2008 |
| JP | 2008260970 A | 10/2008 |
| JP | 2008299905 A | 12/2008 |

*Primary Examiner* — Jessee Roe
(74) *Attorney, Agent, or Firm* — The Webb Law Firm

(57) ABSTRACT

There is provided a soft magnetic alloy for a perpendicular magnetic recording medium having a low coercive force, high amorphous properties, high corrosion resistance, and a high hardness; and a sputtering target for producing a thin film of the alloy. The alloy comprises in at. %: 6 to 20% in total of one or two of Zr and Hf; 1 to 20% of B; and 0 to 7% in total of one or two or more of Ti, V, Nb, Ta, Cr, Mo, W, Ni, Al, Si, and P; and the balance Co and/or Fe and unavoidable impurities. The alloy further satisfies $6 \leq 2 \times (Zr\% + Hf\%) - B\% \leq 16$ and $0 \leq Fe\%/(Fe\% + Co\%) < 0.20$.

6 Claims, No Drawings

SOFT MAGNETIC ALLOY FOR MAGNETIC RECORDING MEDIUM, SPUTTERING TARGET MATERIAL, AND MAGNETIC RECORDING MEDIUM

CROSS-REFERENCE TO RELATED APPLICATION

This application claims priority to Japanese Patent Application No. 2010-186876 filed on Aug. 24, 2010, the entire content of which is incorporated herein by reference.

TECHNICAL FIELD

The present invention relates to a Co-(Zr, Hf)-B-based alloy used for a soft magnetic film layer in a perpendicular magnetic recording medium, a sputtering target material, and a magnetic recording medium.

BACKGROUND ART

In recent years, there have been remarkable progresses in magnetic recording technology, and heightening of recording densities in magnetic recording media has been preceding due to increasing drive capacities. For example, perpendicular magnetic recording system, which achieves further high recording density when compared to longitudinal magnetic recording system conventionally used, has been put into practical use. Perpendicular magnetic recording system is a system in which a magnetization-easy axis is oriented in the direction vertical to the medium surface of a magnetic film of a perpendicular magnetic recording medium and is suitable for a high recording density. For perpendicular magnetic recording system, a double-layer recording medium having a magnetic recording film layer with an increased recording sensitivity and a soft magnetic film layer has been developed. For the magnetic recording film layer, a CoCrPt—SiO$_2$-based alloy is commonly used.

As for a conventional soft magnetic film layer, ferromagnetism and amorphous properties are necessary and, in addition, various properties, such as a high saturation magnetic flux density, high corrosion resistance, and a high hardness, are additionally required depending on applications of perpendicular magnetic recording media and environments in which they are used. For example, as disclosed in Japanese Patent Laid-Open Publication No. 2008-260970 (Patent Literature 1), there are used substances which are based on Co, a ferromagnetic element with high corrosion resistance, and to which amorphization promotion elements including Zr are added to enhance amorphous properties.

As disclosed in Japanese Patent Laid-Open Publication No. 2008-299905 (Patent Literature 2), the addition of Fe results in high saturation magnetic flux density and the addition of B results in high hardness. Furthermore, in recent years, there have been required alloys for soft magnetic films having a low coercive force as well as the conventionally required properties described above.

CITATION LIST

Patent Literature

[PTL 1] Japanese Patent Laid-Open Publication No. 2008-260970
[PTL 2] Japanese Patent Laid-Open Publication No. 2008-299905

SUMMARY OF THE INVENTION

The applicants have now found, as a result of closely examining the influence of alloy elements on the coercive force of the alloy for a soft magnetic film of a perpendicular magnetic recording medium, that a soft magnetic alloy with a low coercive force for a perpendicular magnetic recording medium is obtained by setting the amounts of Zr, Hf, and B in certain ranges. Furthermore, although alloys containing 25% to nearly 60% of Fe, which is an element for obtaining high saturation magnetic flux density, have been mainly used for soft magnetic alloys for perpendicular magnetic recording media and consequently Fe has been often used as an essential element, the applicants also have now found that this addition of Fe greatly increases a coercive force.

It is therefore an object of the present invention to provide a soft magnetic alloy for a perpendicular magnetic recording medium having a low coercive force, high amorphous properties, high corrosion resistance, and a high hardness; and a sputtering target for producing a thin film of the alloy.

According to one embodiment of the present invention, there is provided a soft magnetic alloy for a magnetic recording medium comprising in at. %:
one or two of Zr and Hf: 6 to 20% in total;
B: 1 to 20%; and
one or two or more of Ti, V, Nb, Ta, Cr, Mo, W, Ni, Al, Si, and P: 0 to 7% in total; and
the balance Co and/or Fe and unavoidable impurities, and satisfying formulae below:

$$6 \leq 2 \times (Zr\% + Hf\%) - B\% \leq 16;$$

and $$0 \leq Fe\%/(Fe\% + Co\%) < 0.20.$$

According to another embodiment of the present invention, there is provided a sputtering target material made of the alloy.

According to still another embodiment of the present invention, there is provided a magnetic recording medium comprising a soft magnetic film layer made of the alloy.

DESCRIPTION OF EMBODIMENTS

The present invention is specifically explained below. Unless otherwise specified, "%" as used herein means at. %.

The alloy according to the present invention comprises in at. %: 6 to 20% in total of one or two of Zr and Hf; 1 to 20% of B; and 0 to 7% in total of one or two or more of Ti, V, Nb, Ta, Cr, Mo, W, Ni, Al, Si, and P; and the balance Co and/or Fe and unavoidable impurities, preferably consists essentially of these elements, and more preferably consists of these elements. The alloy further satisfies formulae below:

$$6 \leq 2 \times (Zr\% + Hf\%) - B\% \leq 16;$$

and $$0 \leq Fe\%/(Fe\% + Co\%) < 0.20.$$

The alloy according to the present invention comprises 6 to 20%, preferably 10 to 15%, in total of one or two of Zr and Hf. In the alloy of the present invention, Zr and Hf are effective at improving amorphous properties and are essential elements for obtaining low coercive force by optimizing a correlation with a B addition amount, and a B addition amount of less than 6% fails to provide sufficient amorphous properties and a low coercive force, while that of more than 20% results in an insufficient saturation magnetic flux density.

The alloy according to the present invention comprises 1 to 20%, preferably 5 to 15%, of B. In this alloy, B is effective at improving amorphous properties and is an essential element for obtaining a low coercive force by optimizing a correlation with the amounts of added Zr and Hf. A B addition amount of less than 1% fails to provide sufficient amorphous properties and a low coercive force, while that of more than 20% results in an insufficient saturation magnetic flux density. Also, B has the effect of increasing hardness.

In the alloy according to the present invention, a low coercive force is obtained by setting Zr, Hf, and B addition amounts in the ranges satisfying the formulae below:

$6 \leq 2\times(Zr\%+Hf\%)-B\% \leq 16$, preferably $8 \leq 2\times(Zr\%+Hf\%)-B\% \leq 14$, more preferably $9 \leq 2\times(Zr\%+Hf\%)-B\% \leq 12$.

The coercive force increases outside these ranges. These are the formulae obtained as a result of closely examining the influence of added elements on a coercive force and revealing that there is a range indicating a low coercive force in the course of increasing the amount of added B against the double of the addition amount of Zr%+Hf%.

The alloy according to the present invention may comprise Fe as an optional component and, in this case, it is set in a range satisfying the formulae below:

$0<Fe\%/(Fe\%+Co\%)<0.20$, preferably $0<Fe\%/(Fe\%+Co\%)<0.10$, more preferably b $0<Fe\%/(Fe\%+Co\%)<0.05$.

In this alloy, Fe is effective at increasing saturation magnetic flux density, but the addition of Fe exceeding the ratio defined by the above formula results in increased coercive force. Since Fe is an optional component, the amount of added Fe may be 0% (i.e., without addition of Fe), which is the most preferred.

The alloy according to the present invention may comprise 7% or less, preferably 2% or less, more preferably 1.5% or less, in total of one or two or more of Ti, V, Nb, Ta, Cr, Mo, W, Ni, Al, Si, and P as optional components. In the alloy of the present invention, all of Ti, V, Nb, Ta, Cr, Mo, W, Ni, Al, Si, and P are effective at slightly decreasing coercive force. However, their addition of more than 7% results in a decreased saturation magnetic flux density. Since these elements are optional components, their addition amounts may be 0%.

EXAMPLES

The present invention is specifically explained below with reference to Examples.

Normally, a soft magnetic film layer in a perpendicular magnetic recording medium is obtained by sputtering a sputtering target material having the same composition as that of the film layer to form the film layer on a glass substrate or the like. In this case, the thin film formed by sputtering has been quenched. In contrast, quenched ribbons produced in a single-roll-type liquid quenching device were used as sample materials in Working Examples and Comparative Examples in accordance with the present invention. This is to evaluate the influence of the thin films, which are actually quenched and formed by sputtering, on various properties by the components, in a simple manner using liquid quenched ribbons.

The process conditions of the quenched ribbon were as follows. First of all, a raw material of 30 g weighed to have the composition shown in Table 1 was arc-melted in Ar with a reduced pressure in a water-cooled copper mold having a diameter of about 10 mm and a height of about 40 mm to provide a molten raw material for the quenched ribbon. The production of the quenched ribbon was conducted by a single roll method under the condition in which the molten raw material was set in a silica tube having a diameter of 15 mm and was tapped from a tapping nozzle having a diameter of 1 mm, at an atmosphere pressure of 61 kPa, at an atomizing pressure difference of 69 kPa, and at a rotational number of 3000 rpm of a copper roll (diameter of 300 mm), with a gap between the copper roll and the tapping nozzle being set to 0.3 mm. It was tapped just after melting down of the molten raw material. Quenched ribbons produced in this manner were used as sample materials to evaluate the properties described below.

Evaluation 1

Coercive Force

The quenched ribbon was adhered on a sample stage with a double-faced tape in a vibration-sample-type coercive force meter to measure the coercive force of the quenched ribbon at an initial applied magnetic field of 144 kA/m. Coercive forces of 50 A/m or less; more than 50 A/m and 100 A/m or less; and more than 100 A/m were evaluated as good, fair, and poor, respectively.

Evaluation 2

Saturation Magnetic Flux Density

The saturation magnetic flux density of the quenched ribbon was measured at an applied magnetic field of 1200 kA/m in a VSM device (vibration-sample-type magnetometer). The weight of the sample material was around 15 mg. Saturation magnetic flux densities of not less than 0.5 T and less than 0.5 T were evaluated as good and poor, respectively.

Evaluation 3

Amorphous Properties

In the evaluation of the amorphous properties of the quenched ribbon, when an X-ray diffraction pattern of the amorphous material is measured, no diffraction peak is generally observed to show a halo pattern specific to amorphous materials. Although a diffraction peak is observed in a material not completely amorphous, the height of the peak is lower than that of a crystal material and a halo pattern is also observed. Therefore, the amorphous properties were evaluated by the following method.

The sample material was adhered on a glass plate with a double-faced tape to obtain a diffraction pattern by an X-ray diffraction device. At this time, the sample material was adhered on the glass plate so that a surface to be measured could be a copper-roll-contact surface of the quenched ribbon. The X-ray source was Cu-kα ray, and the measurement was conducted at a scan speed of 4°/min. The diffraction patterns in which a halo pattern was able to be confirmed and in which no halo pattern was observed were considered to be good and poor, respectively, for evaluating amorphous properties.

Evaluation 4

Corrosion Resistance

The sample material was adhered to a glass plate with a double-faced tape and was subjected to a salt splay test with a 5% NaCl solution under the conditions of a temperature of 35° C. and a spray time of 16 hours to evaluate the corrosion resistance of the quenched ribbon. Specifically, the cases of rusting on the whole surface and of rusting in some parts were evaluated as poor and good, respectively.

Evaluation 5

Hardness

The quenched ribbon was longitudinally embedded into a resin and polished to measure the Vickers hardness of the quenched ribbon by a Vickers hardness tester. The measurement was conducted at ten points at a measuring load of 50 g and the evaluation was based on the average. Specifically, hardnesses of 800 HV or more and less than 800 HV were evaluated as good and poor, respectively. The indentation size was about 10 μm.

Results

The results shown in Table 2 were obtained in each of the sample material Nos. 1 to 19 with the compositions shown in Table 1.

TABLE 1

| | Composition (at %) | | | | | | | |
|---|---|---|---|---|---|---|---|---|
| No. | Zr | Hf | B | Fe | Co | Others | 2 × (Zr % + Hf %) − B % | Fe %/(Fe % + Co %) |
| 1 | 0 | 6 | 6 | 0 | Balance | Ti: 5, Cr: 1, Ta: 1 | 6 | 0.000 |
| 2 | 8 | 0 | 1 | 0 | Balance | V: 1, Al: 1 | 15 | 0.000 |
| 3 | 8 | 0 | 4 | 0 | Balance | Nb: 1 | 12 | 0.000 |
| 4 | 8 | 0 | 6 | 0 | Balance | P: 0.5, W: 1 | 10 | 0.000 |
| 5 | 8 | 0 | 8 | 0 | Balance | W: 1 | 8 | 0.000 |
| 6 | 8 | 0 | 10 | 0 | Balance | — | 6 | 0.000 |
| 7 | 5 | 5 | 11 | 0 | Balance | — | 9 | 0.000 |
| 8 | 10 | 5 | 16 | 0 | Balance | — | 14 | 0.000 |
| 9 | 8 | 0 | 8 | 4 | Balance | Si: 1 | 8 | 0.048 |
| 10 | 8 | 0 | 8 | 8 | Balance | Ni: 1, Mo: 1 | 8 | 0.095 |
| 11 | 8 | 0 | 8 | 16 | Balance | — | 8 | 0.190 |
| 12 | 0 | 5 | 1 | 0 | Balance | — | 9 | 0.000 |
| 13 | 16 | 5 | 16 | 0 | Balance | Ta: 1 | 26 | 0.000 |
| 14 | 10 | 5 | 12 | 0 | Balance | — | 18 | 0.000 |
| 15 | 8 | 0 | 12 | 0 | Balance | — | 4 | 0.000 |
| 16 | 0 | 6 | 0 | 0 | Balance | — | 12 | 0.000 |
| 17 | 10 | 5 | 21 | 0 | Balance | Si: 0.5 | 9 | 0.000 |
| 18 | 8 | 0 | 8 | 20 | Balance | — | 8 | 0.238 |
| 19 | 10 | 5 | 16 | 0 | Balance | Nb: 4, P: 4 | 14 | 0.000 |

NOTE:
The underlined figures fall outside the scope of the present invention.

TABLE 2

| No. | Coercive Force | Saturation Magnetic Flux Density | Amorphous Properties | Corrosion Resistance | Hardness | |
|---|---|---|---|---|---|---|
| 1 | Fair | Good | Good | Good | Good | Present Invention |
| 2 | Fair | Good | Good | Good | Good | Examples |
| 3 | Good | Good | Good | Good | Good | |
| 4 | Good | Good | Good | Good | Good | |
| 5 | Fair | Good | Good | Good | Good | |
| 6 | Fair | Good | Good | Good | Good | |
| 7 | Good | Good | Good | Good | Good | |
| 8 | Fair | Good | Good | Good | Good | |
| 9 | Fair | Good | Good | Good | Good | |
| 10 | Fair | Good | Good | Good | Good | |
| 11 | Fair | Good | Good | Good | Good | |
| 12 | Poor | Good | Poor | Good | Good | Comparative |
| 13 | Poor | Poor | Good | Good | Good | Examples |
| 14 | Poor | Good | Good | Good | Good | |
| 15 | Poor | Good | Good | Good | Good | |
| 16 | Poor | Good | Poor | Good | Poor | |
| 17 | Good | Poor | Good | Good | Good | |
| 18 | Poor | Good | Good | Good | Good | |
| 19 | Good | Poor | Good | Good | Good | |

Nos. 1 to 11 are present invention examples while Nos. 12 to 19 are comparative examples, shown in Table 1 and Table 2.

As shown in Table 1 and Table 2, Comparative Example No. 12 results in a high coercive force value and insufficient amorphous properties due to the low content of Hf in the composition. Comparative Example No. 13 results in a high coercive force value and a poor saturation magnetic flux density due to the high total content of Zr and Hf in the composition and the high value of 2×(Zr%+Hf%)−B of the formula (1) according to the composition. Comparative Example No. 14 results in a poor coercive force due to the high value of 2×(Zr%+Hf%)−B of the formula (1) according to the composition.

Comparative Example No. 15 results in a poor coercive force due to the low value of 2×(Zr%+Hf%)−B of the formula (1) according to the composition. Comparative Example No. 16 results in a poor coercive force, insufficient amorphous properties, and a low hardness due to no content of B in the composition. Comparative Example No. 17 results in a poor saturation magnetic flux density due to the high content of B in the composition. Comparative Example No. 18 results in a poor coercive force due to the high value of Fe% (Fe%+Co%) of the formula (2) according to the composition. Comparative Example No. 19 results in a poor saturation magnetic flux density due to the high total amount of Nb and P in the composition.

In contrast, all of Nos. 1 to 11, which are present invention examples, are found to be excellent in each performance of saturation magnetic flux density, amorphous properties, corrosion resistance, and hardness because of satisfying the conditions of the present invention. Present Invention Example Nos. 1, 2, 5, 6, and 8 to 12 have generally excellent performance although being somewhat inferior in coercive force.

Next, there is shown an example of the method for producing a sputtering target material. A molten raw material weighed to have the composition of No. 5 was melted by induction heating in a refractory crucible with an Ar gas atmosphere under a reduced pressure, then tapped from a nozzle having a diameter of 8 mm in the lower portion of the crucible, and atomized with an Ar gas. This gas-atomized powder as a raw powder was filled in a capsule having diameter of 250 mm and a length of 100 mm, made of carbon steel, and was exhausted and vacuum-sealed. This powder-filled billet was HIP-consolidated under the conditions of a consolidation temperature of 1000° C., a consolidation pressure of 147 MPa, and a consolidation time of 5 hours. A sputtering target material having a diameter of 180 mm and a thickness of 7 mm was produced from this HIP body by machining. The sputtering target material was able to be produced without cracking or chipping.

As described above, according to the present invention, a soft magnetic alloy for a perpendicular magnetic recording medium having a low coercive force, high amorphous properties, high corrosion resistance, and a high hardness; and a sputtering target for producing a thin film of the alloy can be provided.

The invention claimed is:

1. A soft magnetic alloy for a magnetic recording medium comprising in at. %:
one or two of Zr and Hf: 6 to 20% in total;
B: 1 to 20%; and
one or two or more of Ti, V, Nb, Ta, Cr, Mo, W, Ni, Al, Si, and P: 0 to 7% in total; and
the balance Co and/or Fe and unavoidable impurities, and satisfying formulae below:

$$6 \leq 2 \times (Zr\% + Hf\%) - B\% \leq 16; \text{ and}$$

$$0 \leq Fe\%/(Fe\% + Co\%) < 0.20.$$

2. The alloy according to claim 1, consisting of in at. %:
one or two of Zr and Hf: 6 to 20% in total;
B: 1 to 20%; and
one or two or more of Ti, V, Nb, Ta, Cr, Mo, W, Ni, Al, Si, and P: 0 to 7% in total; and
the balance Co and/or Fe and unavoidable impurities.

3. The alloy according to claim 1,
wherein an amount of added Fe satisfies a formula below:

$$0 < Fe\%/(Fe\% + Co\%) < 0.20.$$

4. The soft magnetic alloy for a magnetic recording medium according to claim 1, wherein the alloy comprises more than 0% and 7% or less in total of one or two or more of Ti, V, Nb, Ta, Cr, Mo, W, Ni, Al, Si, and P.

5. A sputtering target material made of the alloy according to any one of claims 1 to 4.

6. A magnetic recording medium comprising a soft magnetic film layer made of the alloy according to any one of claims 1 to 4.

* * * * *